US011733328B2

(12) United States Patent
Tsai et al.

(10) Patent No.: US 11,733,328 B2
(45) Date of Patent: Aug. 22, 2023

(54) SIGNAL ANALYSIS CIRCUIT AND METHOD

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 105 days.

(21) Appl. No.: 17/179,349

(22) Filed: Feb. 18, 2021

(65) Prior Publication Data
US 2021/0172981 A1 Jun. 10, 2021

(30) Foreign Application Priority Data
Nov. 2, 2020 (TW) ................................ 109138055

(51) Int. Cl.
*G01R 33/00* (2006.01)
*G01R 33/36* (2006.01)
(Continued)

(52) U.S. Cl.
CPC .......... *G01R 33/3614* (2013.01); *H02J 50/10* (2016.02); *H02J 50/12* (2016.02); *H04B 5/0037* (2013.01)

(58) Field of Classification Search
CPC ................................................ G01R 33/3614
See application file for complete search history.

(56) References Cited

U.S. PATENT DOCUMENTS 8,742,745 B2 * 6/2014 Huang .................... H02M 1/44
323/285
9,671,444 B2 6/2017 Tsai
(Continued)

FOREIGN PATENT DOCUMENTS

| CN | 105637771 B | 9/2018 |
|----|-------------|--------|
| JP | 2018-64333 | 4/2018 |
| TW | I660554 B | 5/2019 |

OTHER PUBLICATIONS

Website—Circuit Digest "D Type Flip-Fop: Circuit, Truth Table and Working"—Sep. 27, 2017 (available at (https://circuitdigest.com/electronic-circuits/d-flip-flops#:~:text=The%20D(Data)%20is%20the,presence%20of%20the%20clock%20signal). (Year: 2017).*
(Continued)

*Primary Examiner* — Adi Amrany
(74) *Attorney, Agent, or Firm* — Winston Hsu

(57) ABSTRACT

A signal analysis circuit for determining whether a supplying-end module of an induction type power supply system receives a modulation signal from a receiving-end module includes a signal receiving circuit, a gain amplifier, a ramp generator, a comparator, a timer and a processor. The signal receiving circuit is configured to obtain a coil signal on a supplying-end coil of the supplying-end module. The gain amplifier is configured to adjust a voltage level of the coil signal to generate an amplification signal. The ramp generator is configured to generate and output a ramp signal. The comparator is configured to compare the amplification signal with the ramp signal to determine a trigger time on which the amplification signal and the ramp signal intersect. The timer is configured to obtain a time data corresponding to the trigger time. The processor is configured to analyze the modulation signal according to the time data.

15 Claims, 8 Drawing Sheets

(51) Int. Cl.
*H02J 50/10* (2016.01)
*H02J 50/12* (2016.01)
*H04B 5/00* (2006.01)

(56) References Cited

U.S. PATENT DOCUMENTS

| | | | |
|---|---|---|---|
| 9,827,976 B2 | 11/2017 | Ichikawa | |
| 9,831,687 B2 | 11/2017 | Tsai | |
| 9,960,639 B2 | 5/2018 | Tsai | |
| 10,056,944 B2 | 8/2018 | Tsai | |
| 10,128,696 B2 | 11/2018 | Iwasaki | |
| 10,312,748 B2 | 6/2019 | Tsai | |
| 10,574,095 B2 | 2/2020 | Tsai | |
| 10,686,331 B2 | 6/2020 | Tsai | |
| 2012/0155133 A1* | 6/2012 | Kim | H02J 50/50 323/284 |
| 2014/0091774 A1* | 4/2014 | Srinivasan | G05F 1/468 323/271 |
| 2014/0159653 A1* | 6/2014 | Von Novak | H04B 5/0031 320/108 |
| 2014/0191568 A1* | 7/2014 | Partovi | H02M 3/33515 307/31 |
| 2014/0269886 A1* | 9/2014 | Plumb | H04L 25/03834 375/232 |
| 2016/0124447 A1* | 5/2016 | Kobayashi | G05F 1/575 323/280 |
| 2016/0308404 A1* | 10/2016 | Tsai | H02J 50/80 |
| 2017/0256956 A1* | 9/2017 | Irish | H02J 50/12 |
| 2019/0097447 A1 | 3/2019 | Partovi | |
| 2019/0190319 A1 | 6/2019 | Kawamae | |
| 2019/0288559 A1 | 9/2019 | Kato | |
| 2019/0363582 A1 | 11/2019 | Mao | |
| 2021/0194363 A1* | 6/2021 | Chang | H02M 1/0025 |
| 2021/0257998 A1* | 8/2021 | Fesler | H02M 1/088 |

OTHER PUBLICATIONS

Website—Analog Devices "Flip-Flop Electronics", no date, but found through a Google search with a filter to only return results from prior to Nov. 2, 2020 (available at (https://circuitdigest.com/electronic-circuits/d-flip-flops#:~:text=The%20D(Data)%20is%20the,presence%20of%20the%20clock%20signal (Year: 2020).*
Website—Electronics Course "D Flip Flop". Jul. 21, 2015 (available at https://electronics-course.com/d-flip-flop) (Year: 2015).*

* cited by examiner

SIGNAL ANALYSIS CIRCUIT AND METHOD

BACKGROUND OF THE INVENTION

1. Field of the Invention

The present invention relates to a signal analysis circuit and method, and more particularly, to a signal analysis circuit and method for an induction type power supply system.

2. Description of the Prior Art

In an induction type power supply system, the power supply terminal and the power receiving terminal each has a coil for performing induction. During operations of the coils, the relative distance between the two coils is usually smaller than the coils' diameter. Also, due to the close distance between the two coils, the electric characteristics of the coils will interact during induction. In the above power supply system, the power transmission is controlled by the power supply terminal, and the power output status is detected by the power receiving terminal, wherein the power receiving terminal needs to send data to the power supply terminal to communicate with the power supply terminal. Since there is no physical circuit connection between the power supply terminal and the power receiving terminal, a wireless communication technology should be utilized to perform communications. The common communication method in the industry is to change the electric characteristics of the receiving-end coil through the signal modulation technology at the power receiving end, and reflect it to the power supply terminal to cause a signal change on the supplying-end coil. The power supply terminal then uses a demodulation technology to restore the modulation signal of the power receiving terminal, and then decodes the combination of the modulation signals to convert the modulation signals into data codes.

However, the signal components on the supplying-end coil are quite complex. The main signal is a resonant signal generated from the interaction of the capacitor and coil driven by the power driver, and its frequency and phase difference may change rapidly due to variation of the output power. The modulation signal generated at the power receiving terminal may be fed back to the supplying-end coil, and the amplitude variation caused by the modulation signal is quite weak compared to the main signal. In addition, the load variations and the noises on the load at the output terminal may also be reflected to the supplying-end coil.

At present, the most common method for commercially available products is to use a low-pass filter to extract low-frequency modulation signals on the main carrier in a higher frequency. This technology has several drawbacks. First of all, the modulation depth should be large enough to be interpreted by the filter. The modulation intensity represents the intensity of the electric characteristic variation applied to the receiving-end coil by the power receiving terminal. The excessive modulation signal may generate a loading on the coil and affect the output power. Furthermore, the power transmission signal on the main carrier may change with power variations, and the filter cannot possess satisfactory filtering capability under both high power (large amplitude of the main carrier) and low power (small amplitude of the main carrier). In addition, the noises generated from load variations of the power receiving terminal may also interfere with the operations of the filter.

U.S. Pat. No. 10,312,748B2 provides a filter-free signal analysis method, which may compare the main carrier signal by establishing a reference voltage level to obtain the trigger status and determine the variations of the main carrier signal accordingly. However, the establishment of the reference voltage level may be adjusted to a suitable level only after repeated confirmation of multiple signal cycles. Therefore, this technology cannot analyze the modulation signal in real time, and it takes multiple signal cycles to reestablish the reference voltage level when the load varies.

In the induction type power supply system, the signal on the supplying-end coil is mainly the main carrier used for power transmission; hence, the power supply terminal needs to analyze the small amplitude variations caused by the modulation signal on the main carrier signal for demodulation. However, the frequency and phase of the main carrier may change at any time, which increases the difficulty of signal analysis. As mentioned above, the conventional method of using a filter has poor performance, and the filter-free signal analysis technology cannot obtain the modulation signal on the main carrier in real time. Thus, how to complete the analysis of modulation signal in a very short time has become an important issue in the field of inductive charging.

SUMMARY OF THE INVENTION

It is therefore an objective of the present invention to provide a signal analysis circuit and method capable of analyzing the modulation signal in the supplying-end module of the induction type power supply system.

An embodiment of the present invention discloses a signal analysis circuit fora supplying-end module of an induction type power supply system, for determining whether the supplying-end module receives a modulation signal from a receiving-end module of the induction type power supply system. The signal analysis circuit comprises a signal receiving circuit, a gain amplifier, a ramp generator, a comparator, a timer and a processor. The signal receiving circuit is configured to obtain a coil signal on a supplying-end coil of the supplying-end module. The gain amplifier, coupled to the signal receiving circuit, is configured to adjust a voltage level of the coil signal to generate an amplification signal. The ramp generator is configured to generate and output a ramp signal. The comparator, coupled to the gain amplifier and the ramp generator, is configured to compare the amplification signal with the ramp signal to determine a trigger time on which the amplification signal and the ramp signal intersect. The timer, coupled to the comparator, is configured to obtain a time data corresponding to the trigger time. The processor, coupled to the timer, is configured to analyze the modulation signal according to the time data.

Another embodiment of the present invention discloses a signal analysis method, for an induction type power supply system of a supplying-end module, for determining whether the supplying-end module receives a modulation signal from a receiving-end module of the induction type power supply system. The signal analysis method comprises steps of: obtaining a coil signal on a supplying-end coil of the supplying-end module; adjusting a voltage level of the coil signal to generate an amplification signal; generating and outputting a ramp signal; comparing the amplification signal with the ramp signal to determine a trigger time on which the amplification signal and the ramp signal intersect; and obtaining a time data corresponding to the trigger time, and analyzing the modulation signal according to the time data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
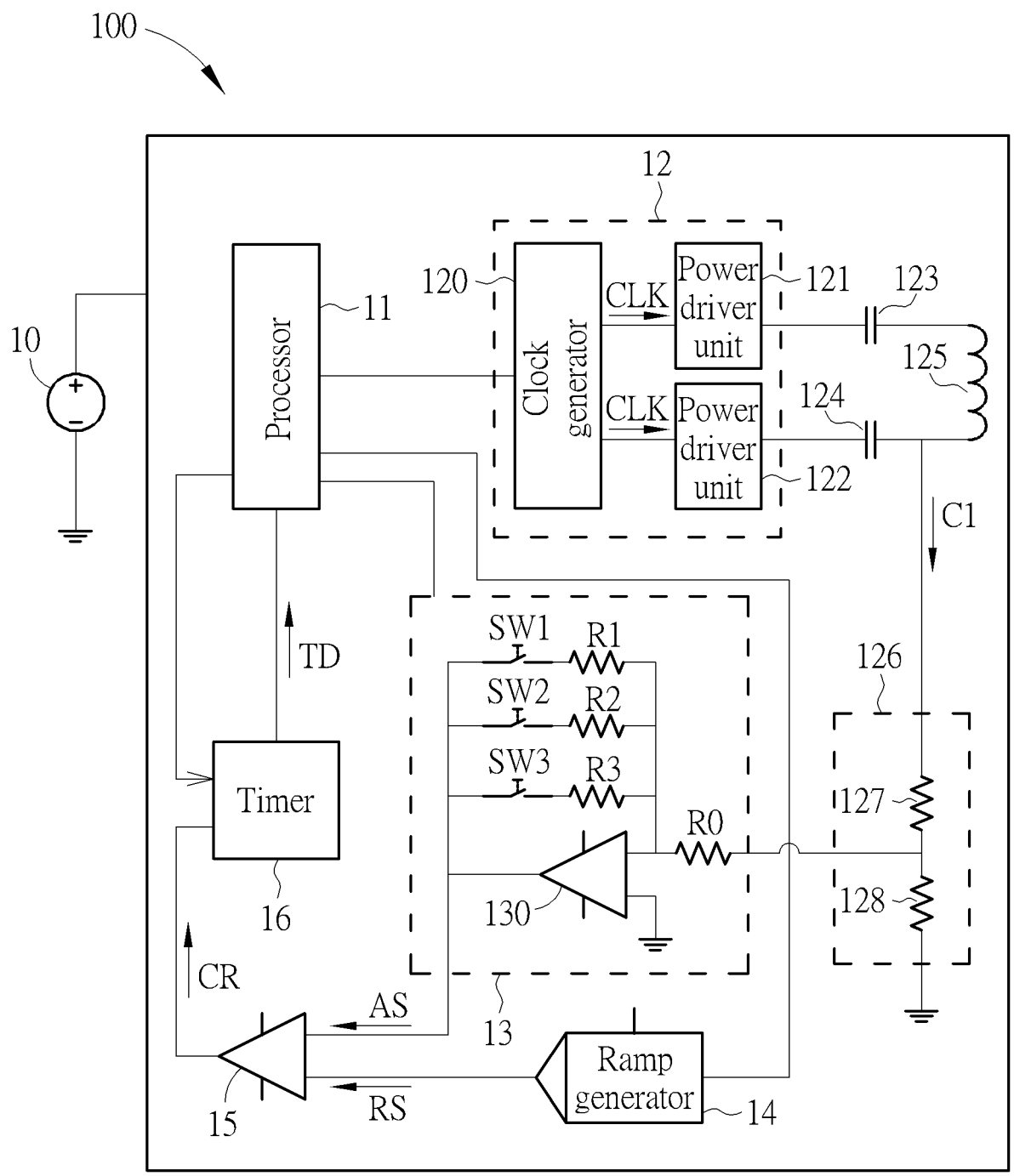
FIG. 1 is a schematic diagram of a supplying-end module according to an embodiment of the present invention.

Please refer to FIG. 1, which is a schematic diagram of a supplying-end module 100 according to an embodiment of the present invention. As shown in FIG. 1, the supplying-end module 100, which is used for an induction type power supply system, includes a processor 11, a power driver circuit 12, resonant capacitors 123 and 124, a supplying-end coil 125, a signal receiving circuit 126, a gain amplifier 13, a ramp generator 14, a comparator 15 and a timer 16. The supplying-end module 100 may receive electric power from a power source 10, and output wireless power to a receiving-end module of the induction type power supply system (not illustrated). In the supplying-end module 100, the supplying-end coil 125 is used for sending electromagnetic energies to the receiving-end module to supply electric power. The resonant capacitors 123 and 124 are coupled to the two terminals of the supplying-end coil 125, respectively, and may be used to resonate with the supplying-end coil 125 during power supply. The supplying-end coil 125 and the resonant capacitors 123, 124 are disposed as a C-L-C structure, but those skilled in the art should understand that the resonant capacitor and the coil may be deployed as one single-ended capacitor or other feasible structure, and the deployment is not limited thereto. In addition, in the supplying-end module 100, a magnetic conductor (not illustrated) composed of magnetic materials may be selectively applied for increasing the electromagnetic induction capability of the supplying-end coil 125 and also preventing the electromagnetic energies from affecting the objects at the non-induction side of the coil.

In the supplying-end module 100, the processor 11 and the power driver circuit 12 are configured to control the operations of the supplying-end coil 125 and the resonant capacitors 123, 124. In detail, the power driver circuit 12 includes a clock generator 120 and power driver units 121 and 122. The clock generator 120 is configured to generate and output a clock signal CLK corresponding to the output power. The power driver units 121 and 122, which are controlled by the clock signal CLK, are configured to drive the supplying-end coil 125 to generate and deliver energies. When the power driver units 121 and 122 are both active, full-bridge driving is performed. In several embodiments, only one of the power driver units 121 and 122 is active or only one of the power driver units 121 and 122 is disposed, which leads to half-bridge driving. The processor 11 is configured to control the frequency of the clock signal CLK output by the clock generator 120, in order to control the power driver units 121 and 122 to drive the supplying-end coil 125 to supply power with an appropriate power level. In addition, the processor 11 is also configured to perform signal analysis and interpretation, to determine whether the supplying-end module 100 receives a modulation signal from the receiving-end module. The processor 11 may be a central processing unit (CPU), a microprocessor, a micro controller unit (MCU), or any other type of digital signal processing device or computation device.

In order to allow the modulation signal to be effectively interpreted by the processor 11, the supplying-end module 100 may obtain the signal C1 on the supplying-end coil 125 through the signal receiving circuit 126, and then perform a series of processing on the signal C1 in the subsequent circuits to convert it into digital data. In detail, the signal receiving circuit 126 may be a voltage dividing circuit, which includes voltage dividing resistors 127 and 128. Since the coil signal C1 usually has a relatively larger voltage, the voltage dividing resistors 127 and 128 may attenuate the coil signal C1 to generate a divided voltage signal, which is then input to the subsequent circuit for processing. In some embodiments, if the back-end circuit elements used to process the coil signal C1 have sufficient withstand voltage, the coil signal C1 on the supplying-end coil 125 may be directly processed without voltage division. The gain amplifier 13 may receive the coil signal C1 with or without voltage division, and amplify and adjust the voltage of the coil signal C1 to generate an amplification signal AS. As shown in FIG. 1, the gain amplifier 13 may be a programmable gain amplifier (PGA), and include an amplifier unit 130, resistors R0-R3 and switches SW1-SW3. The resistors R1-R3 may have different resistance values, and different amplification ratio (programmable gain) may be realized through switching of the switches SW1-SW3. Note that the structure of the gain amplifier 13 shown in FIG. 1 is one of various implementations of the present invention. In another embodiment, any number of switches and resistors may be disposed to realize multiple amplification ratios according to system requirements, or other type of amplifier may be used to realize the programmable gain. The ramp generator 14 is configured to generate and output a ramp signal RS. The ramp signal RS may be a periodic signal having rising or falling ramps, and its period length and slope are adjustable and may be controlled by the processor 11. The comparator 15 is configured to compare the amplification signal AS with the ramp signal RS to output a comparison result CR. In detail, the comparator 15 may determine a trigger time on which the amplification signal AS and the ramp signal RS intersect, which is obtained by monitoring the switching time point of the comparison result CR. The timer 16 may further obtain a time data TD corresponding to the trigger time, and output the time data TD to the processor 11. The above operations may be performed periodically, so that the processor 11 may continuously obtain multiple time data TD for interpretation, in order to analyze the modulation signal.

In general, the modulation signal is generated by applying a variation to the electric characteristics of the receiving-end coil in the power receiving terminal, and the variation is fed back to the supplying-end coil 125 and then generates up and down jitters of amplitude on the coil signal C1. This belongs to an amplitude modulation scheme. After the coil signal C1 is received by the signal receiving circuit 126 of and amplified by the gain amplifier 13, the feature of amplitude jitter still remains on the amplification signal AS. Subsequently, the amplification signal AS is compared with the fixed ramp signal RS. Due to the signal features, the amplification signal AS has a slight height difference in each signal cycle, so that the trigger time obtained after comparison is also different. The trigger time may be converted into the digital time data TD through the timer 16, thereby generating the time data TD carrying the signal features. For example, the processor 11 may obtain a time data string including N time data TD in N consecutive signal cycles, and determine whether the modulation signal exists according to the variation of the time data TD. In an embodiment, assuming that the coil signal C1 does not include a modulation signal, the generated time data string may include time data TD such as 100, 100, 100, 99, 100, 100, 100, 100, 99 . . . , which almost have no difference. If the coil signal C1 includes up and down jitters of the modulation signal, the generated time data string may include time data TD such as 100, 98, 96, 95, 96, 98, 100, 102, 104, 105, 104, 102, 100 . . . , which reflects the feature of the up and down jitter of the modulation signal.

In U.S. Pat. No. 10,312,748B2, a reference voltage level may be established to compare the main carrier signal to determine whether a trigger appears in each signal cycle. The up and down jigger generated from the modulation signal may form the signal features with sometimes trigger and sometimes non-trigger, and the determination may be performed accordingly. In contrast, the present invention may convert the height of the modulation signal into a series of corresponding digital values (i.e., the time data TD). Compared with the trigger/non-trigger result of the prior art, the analysis of digital values may realize more accurate judgment of the signal features. In addition, in the prior art, a reference voltage level is established to determine the triggering or not, where an appropriate reference voltage level is established after the signal is confirmed to be stable, and the valid triggering result may be obtained only after the voltage level is established. Therefore, the data before establishment of the voltage level cannot be used, and when the load variation causes the coil signal to change, it takes a long time to reestablish the reference voltage level. In contrast, through the signal analysis method of the present invention, the time data string may be input to the processor 11 and/or stored in the system memory or register in real time, and whether the jitter feature of the modulation signal exists in the time data string is determined by analyzing in a suitable manner. Further, different reference values or different analysis method may be applied to the same time data string, which is not limited to the comparison of only one reference value (as corresponding to only one reference voltage level). As a result, in the present invention, it does not need to wait for the establishment of the reference voltage. As long as a trigger occurs and the corresponding time data TD is obtained, a series of time data TD may be used for interpretation, so as to realize the effect of real-time signal analysis.

Figure 2:
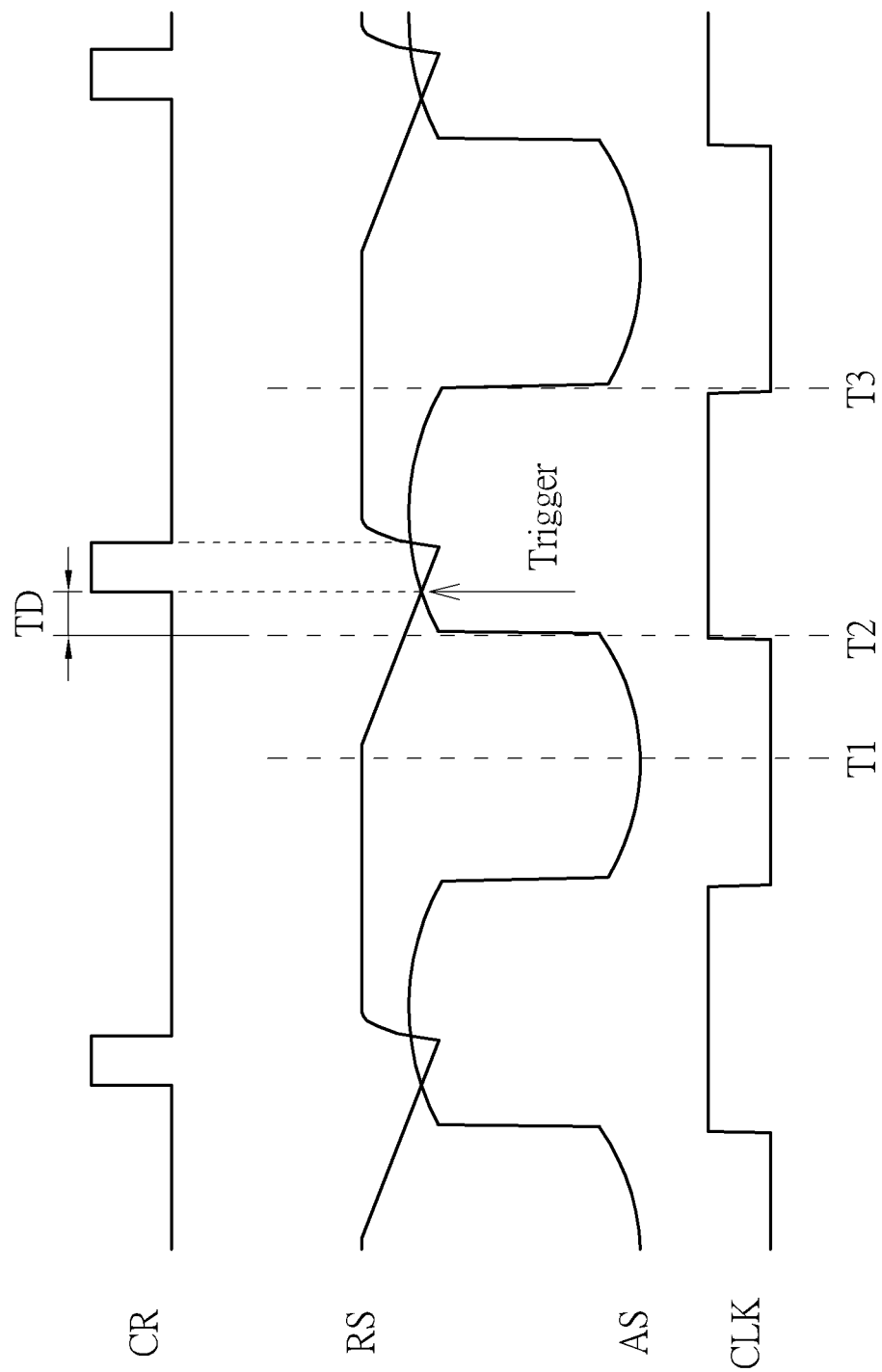
FIG. 2 is a waveform diagram of signals of the supplying-end module according to an embodiment of the present invention.

Please refer to FIG. 2, which is a waveform diagram of signals of the supplying-end module 100 according to an embodiment of the present invention. FIG. 2 illustrates the waveforms of the amplification signal AS output by the gain amplifier 13, the ramp signal RS output by the ramp generator 14, the comparison result CR output by the comparator 15, and the clock signal CLK for driving the supplying-end coil 125 shown in FIG. 1. As shown in FIG. 2, when the supplying-end module 100 outputs power normally, the cycle of the clock signal CLK is the same as the cycle of the coil signal C1, and also the same as the cycle of the amplification signal AS, where a trigger occurs in each signal cycle; that is, there is a trigger time on which the ramp signal RS and the amplification signal AS intersect in each cycle. In this embodiment, the trigger is configured to occur in the half signal cycle where the clock signal CLK is at the high level, so the rising edge of the clock signal CLK may be set as the start time of the signal cycle (time T2), and whether a trigger occurs is determined in the first half cycle. The ramp generator 14 may control the ramp signal RS to start to decrease from an appropriate level in the second half period of the previous signal cycle (for example, at the position of 75% of the duty cycle; that is, time T1), so as to successfully trigger in the present half signal cycle. The ramp signal RS then returns to the original level and waits for decreasing of the next cycle after the trigger is completed. In an embodiment, the timer 16 may be controlled to start to run at the start time of the signal cycle. Then, at the time point on which the ramp signal RS and the amplification signal AS intersect first, the time period of the timer 16 may be obtained as the trigger time, and the length of the trigger time may be correspondingly converted into the time data TD and sent to the processor 11. One time data TD may be obtained each signal cycle, so as to generate a data string used for interpreting the modulation signal.

Figure 3:
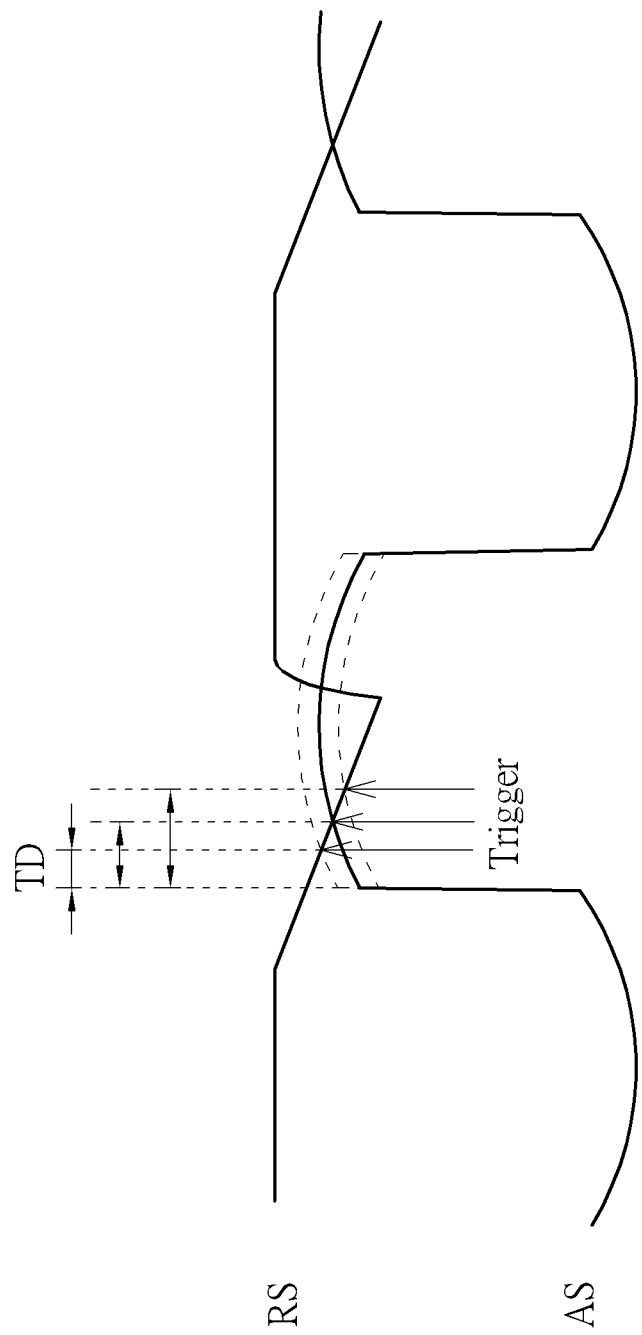
FIG. 3 illustrates different trigger times generated from the up and down jitter of the amplification signal.

When the modulation signal appears, small up and down jiggers may be generated on the coil signal C1 and also reflected on the amplification signal AS. As shown in FIG. 3, with the same ramp signal RS, the jitter of the amplification signal AS may generate different trigger times. In this embodiment, a higher amplification signal AS makes the trigger time earlier, so that the time recorded by the timer 16 will decrease, thereby generating the time data TD having a lower value. A lower amplification signal AS delays the trigger time, so that the time recorded by the timer 16 will increase, thereby generating the time data TD having a higher value. The modulation signal may produce jitters with inconsistent levels over multiple consecutive signal cycles, so as to form variations in the values of the time data TD. In such a situation, the present invention does not require the absolute voltage peak value in each oscillation of the coil signal C1. As long as the signal feature of amplitude modulation appears and causes a signal jitter, this may be reflected as the variations of data values of the time data TD.

Please note that in actual operations, it is not possible to successfully trigger and obtain the time data TD in every cycle. For example, when the load changes, the voltage of the coil signal C1 may change significantly. At this time, the amplification signal AS output by the gain amplifier 13 may also change proportionally. Therefore, in order to generate a trigger (i.e., to make the amplification signal AS and the ramp signal RS intersect), the slope of the ramp signal RS should be adjusted and/or the amplification ratio of the gain amplifier 13 should be modified, so that the amplification signal AS and the ramp signal RS are adjusted to similar voltage levels to be able to cross each other.

Figure 4:
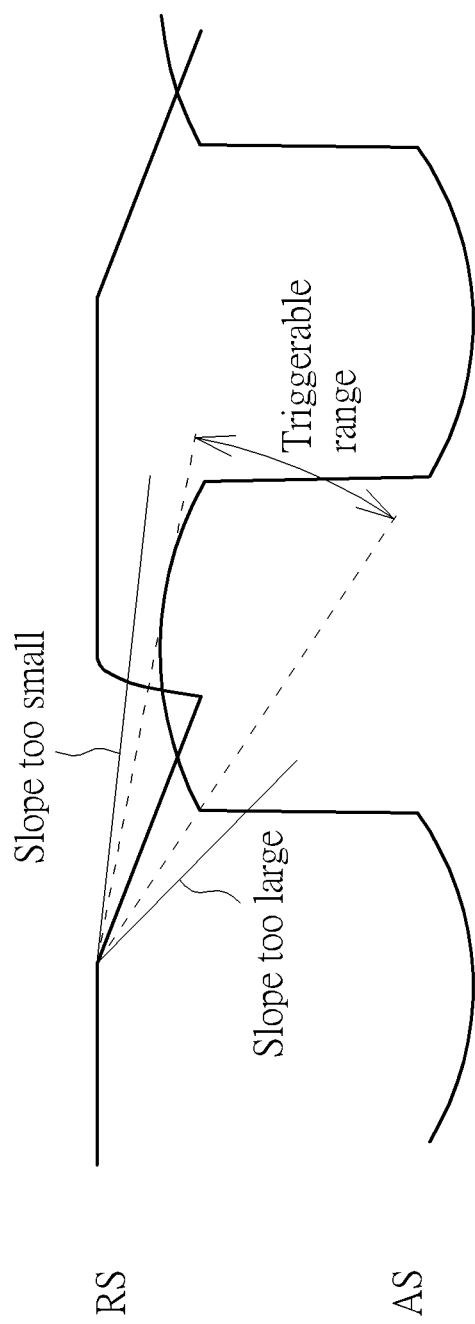
FIG. 4 is a schematic diagram of adjusting the slope of the ramp signal to trigger successfully according to an embodiment of the present invention.

Please refer to FIG. 4, which is a schematic diagram of adjusting the slope of the ramp signal RS to trigger successfully according to an embodiment of the present invention. As shown in FIG. 4, the slope of the ramp signal RS may have a value that is too large or too small. At this time, the slope may be decreased or increased to enter a triggerable range. To facilitate understanding, the absolute value of the slope is served to define its magnitude; that is, a decrease in the slope value represents that the slope becomes gentle, and an increase in the slope value represents that the slope becomes inclined.

Figure 5:
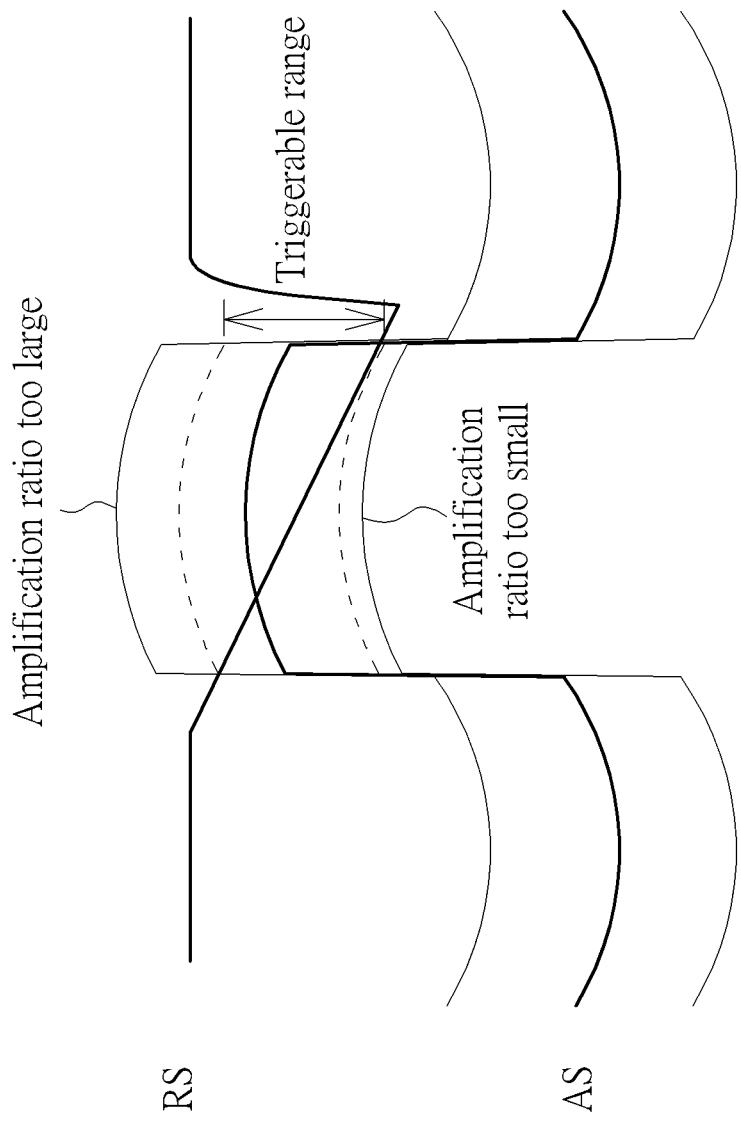
FIG. 5 is a schematic diagram of adjusting the amplification ratio of the gain amplifier to trigger successfully according to an embodiment of the present invention.

Please refer to FIG. 5, which is a schematic diagram of adjusting the amplification ratio of the gain amplifier 13 to trigger successfully according to an embodiment of the present invention. As shown in FIG. 5, the amplification ratio of the gain amplifier 13 may be excessively large or small such that the voltage of the amplification signal AS is excessively high or low to cause unsuccessful triggering. Therefore, in addition to adjusting the slope of the ramp signal RS, the amplification ratio of the gain amplifier 13 may also be adjusted (e.g., through switching of the switches SW1-SW3 shown in FIG. 1), allowing the amplification signal AS to enter the triggerable range.

Figure 6:
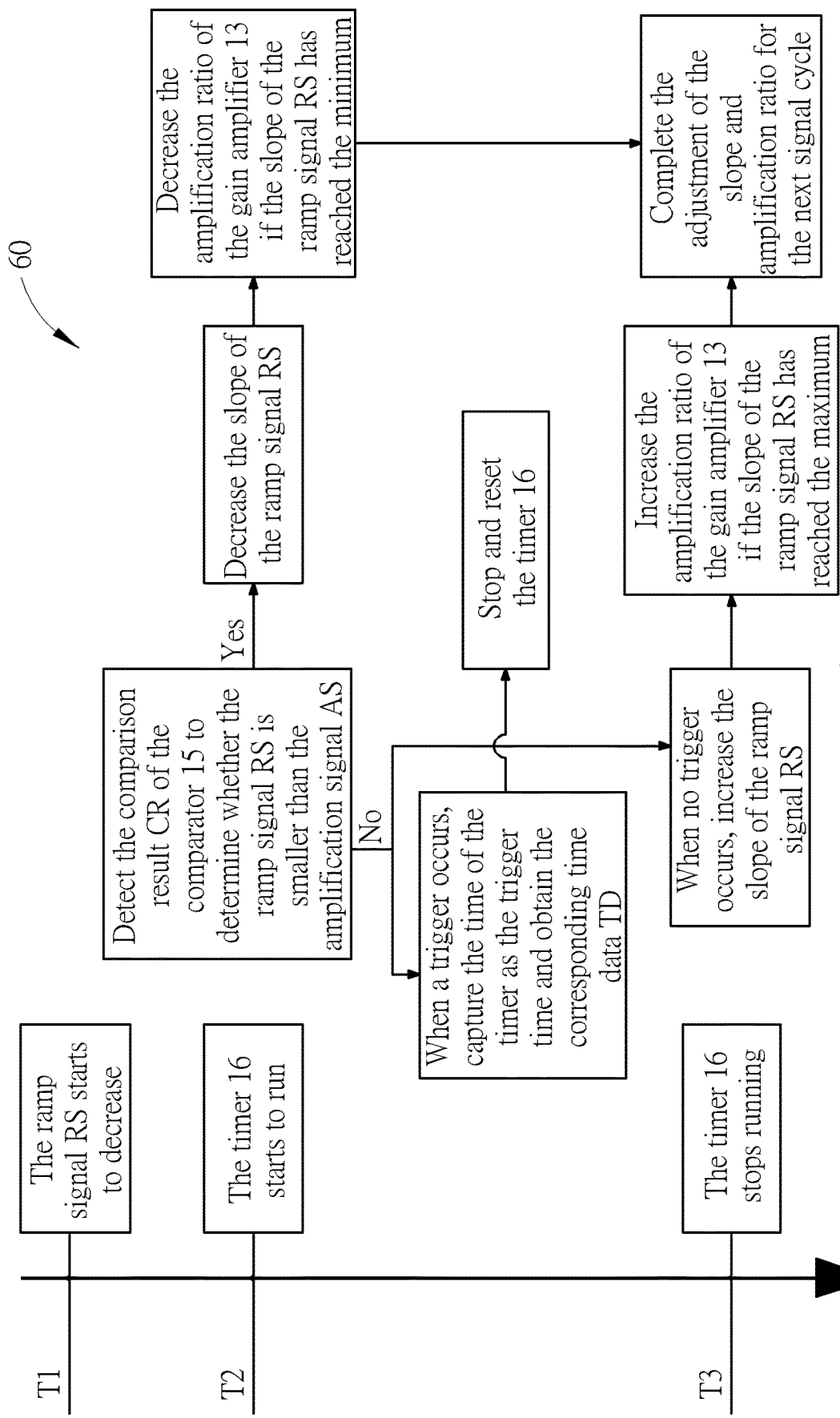
FIG. 6 is a schematic diagram of a signal analysis process according to an embodiment of the present invention.

When the trigger is unsuccessful, the processor 11 may determine to adjust the slope of the ramp signal RS and/or change the amplification ratio of the gain amplifier 13. The related implementation may be summarized into an algorithm, as the signal analysis process 60 shown in FIG. 6. Please refer to FIG. 6 and also refer to FIGS. 1 and 2. First, during the second half period of the previous signal cycle (such as time T1), the ramp generator 14 may control the ramp signal RS to start to decrease. Subsequently, at the start of the present half signal cycle (such as time T2), the timer 16 may be activated and start to run. At this time, the processor 11 may first detect the comparison result CR of the comparator 15 to determine whether the ramp signal RS is smaller than the amplification signal AS. In this embodiment, because the ramp signal RS is a falling signal, if the ramp signal RS is smaller than the amplification signal AS at the start of the half signal cycle, the trigger may not appear in this half signal cycle (i.e., the ramp signal RS is not in the triggerable range). In such a situation, the slope of the ramp signal RS and/or the amplification ratio of the gain amplifier 13 needs to be adjusted. In detail, in order to trigger successfully, the ramp generator 14 may be controlled to decrease the slope of the ramp signal RS, so that the ramp signal RS may be gentler. However, due to the limited variation range of the slope, if the slope of the ramp signal RS has reached the minimum, the gain amplifier 13 may be controlled to decrease the amplification ratio. After the adjustment is completed, the new settings of slope and amplification ratio may be used for trigger judgment in the next signal cycle.

If the ramp signal RS is greater than the amplification signal AS at the start of the half signal cycle, a trigger may occur. Subsequently, a trigger occurs when the ramp signal RS decreasing to be equal to the amplification signal AS in the half signal cycle is detected. At this moment, the processor 11 may capture the time of the timer 16 as the trigger time, and obtain the corresponding time data TD. This time data TD may be used for subsequent analysis and interpretation of the modulation signal. If a successful trigger appears, there is no need to adjust the slope of the ramp signal RS or the amplification ratio of the gain amplifier 13, and the same settings of slope and amplification ratio may be maintained for the judgment of trigger in the next signal cycle. Meanwhile, since the timer 16 has completed the timing operation, the timer 16 may be stopped and reset, and the ramp signal RS returns to the initial voltage for operations in the next signal cycle.

On the other hand, if the ramp signal RS and the amplification signal AS do not intersect until the end of the half signal cycle (such as time T3), i.e., the ramp signal RS does not fall to be equal to or lower than the amplification signal AS, the timer 16 may also be controlled to stop running and reset. At this moment, the processor 11 determines that no trigger occurs, and adjusts the slope of the ramp signal RS and/or the amplification ratio of the gain amplifier 13 accordingly. In detail, the ramp generator 14 may be controlled to increase the slope of the ramp signal RS, allowing the ramp signal RS to be more inclined. If the slope of the ramp signal RS has reached the maximum, the gain amplifier 13 may be controlled to increase the amplification ratio. After the adjustment is completed, the new settings of slope and amplification ratio may be used for trigger judgment in the next signal cycle.

In the adjustment scheme of the signal analysis process 60, the processor 11 adjusts the slope of the ramp signal RS first, and adjusts the amplification ratio of the gain amplifier 13 when the slope has reached the extreme value and cannot be adjusted any more. However, in another embodiment, it is also possible to first determine whether the amplification ratio of the gain amplifier 13 is adjustable, and then determine whether to adjust the amplification ratio or the slope accordingly. Alternatively, the adjustment way may be determined according to the difference of the ramp signal RS and the amplification signal AS, or the slope and the amplification ratio may also be adjusted simultaneously, but not limited thereto.

Please note that the present invention aims at providing a signal analysis circuit and method which are capable of converting the up and down jitter of the coil signal into the values of time data, and performing signal analysis and interpretation in digital domain. Those skilled in the art may make modifications and alterations accordingly. For example, in the above embodiment, the signal receiving circuit 126 obtains the coil signal C1 between the resonant capacitor 124 and the supplying-end coil 125 for processing and analysis. In another embodiment, the coil signal for subsequent processing may also be obtained from another terminal of the supplying-end coil 125 (i.e., between the resonant capacitor 123 and the supplying-end coil 125). Since the signals at both ends of the supplying-end coil 125 are opposite to each other, the output timing of the ramp signal RS may be adjusted to determine the occurrence of trigger in the second half signal cycle. Alternatively, the low level part of the coil signal may be captured to be compared with the ramp signal RS having corresponding voltage level to determine the occurrence of trigger. In addition, both of the magnitude of the slope of the ramp signal RS and the amplification ratio of the gain amplifier 13 may be set to appropriate values based on system requirements, as long as a trigger may be generated. Although the change of the slope or amplification ratio will cause the time data TD to change, the concept of the present invention is to utilize the relative variations of a series of time data TD to determine whether a feature of signal jitter appears. The change of the absolute value of time data TD does not affect the signal analysis result. Moreover, the signal analysis method of the present invention is applicable to a wide range of voltages. For example, when the load of the induction type power supply system changes, the voltage level, cycle length and phase of the coil signal C1 will all change significantly. At this time, the processor 11 may control the gain amplifier 13, the ramp generator 14 and the timer 16 to adjust correspondingly. For example, when the cycle of driving the supplying-end coil 125 changes, the processor 11 may control the signal cycle of the timer 16 obtaining the time data TD to be corresponding to the cycle of the coil signal C1, so that the timing operation of the timer 16 may be synchronized with the driving operation of the power driver circuit 12. In addition, as the voltage level of the coil signal C1 changes, the amplification ratio of the gain amplifier 13 and/or the slope of the ramp generator 14 may be adjusted correspondingly, in order to generate the trigger successfully.

In the above embodiment, the ramp signal RS is a falling signal, which crosses the amplification signal AS from top to down to generate a trigger. In another embodiment, the ramp signal RS may also be configured as a rising signal, to cross the amplification signal AS from bottom to up to generate a trigger. In such a situation, the determination process of signal triggering and the adjustments of the amplification ratio of the gain amplifier 13 and the slope of the ramp generator 14 may also be performed correspondingly.

Figure 7:
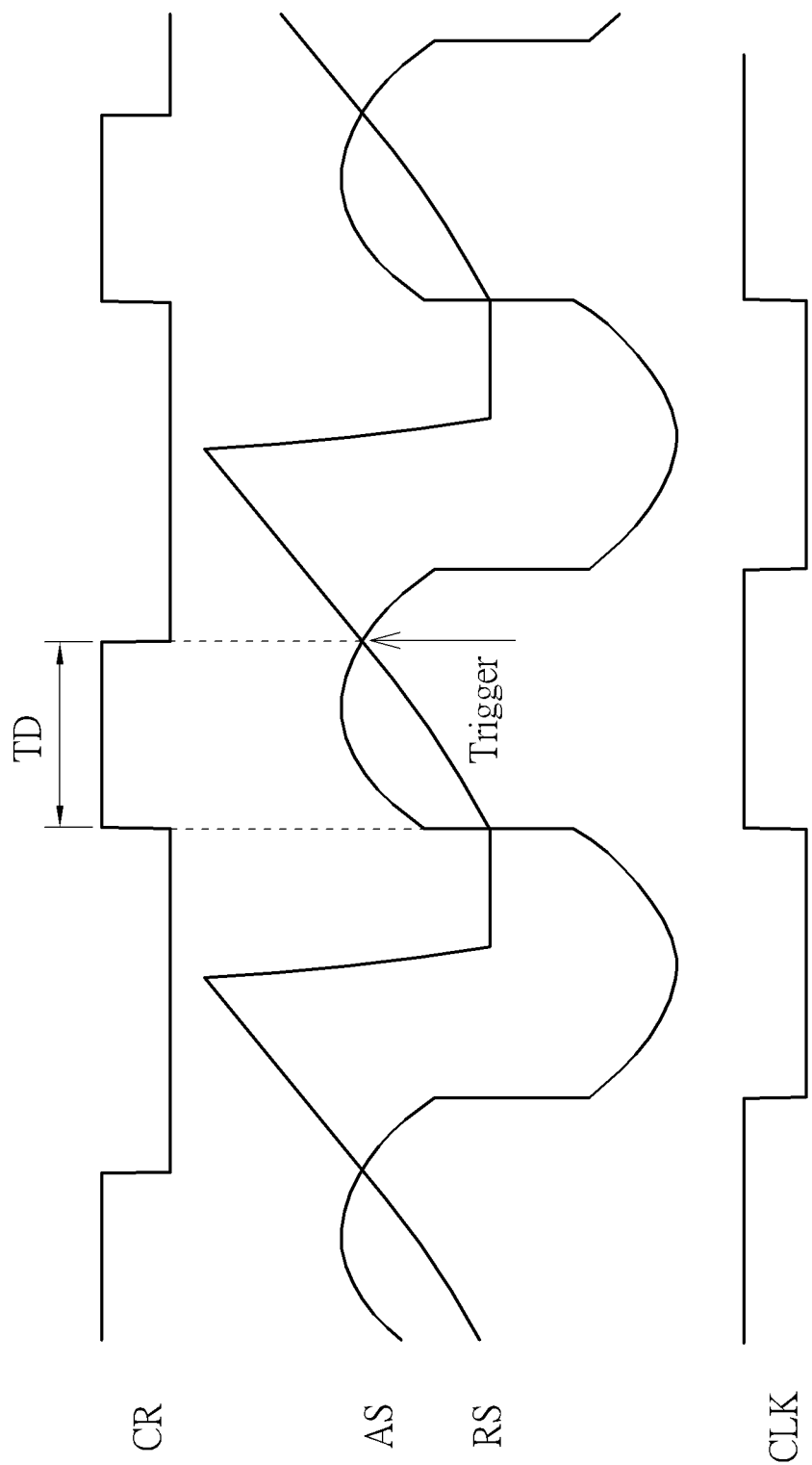
FIG. 7 is another waveform diagram of signals of the supplying-end module according to an embodiment of the present invention.

For example, please refer to FIG. 7, which is another waveform diagram of signals of the supplying-end module 100 according to an embodiment of the present invention. FIG. 7 shows an embodiment using the rising signal to implement the ramp signal RS. When the ramp signal RS is a rising signal, if the ramp signal RS is greater than the amplification signal AS at the start of the half signal cycle (as different from the judgment method of the falling ramp signal), the trigger may not appear in this half signal cycle (i.e., the ramp signal RS is not in the triggerable range). In such a situation, it is necessary to control the ramp generator 14 to decrease the slope of the ramp signal RS, or control the gain amplifier 13 to increase the amplification ratio, to adjust these parameters toward the triggerable range. Subsequently, when there is no trigger in the half signal cycle, it is necessary to control the ramp generator 14 to increase the slope of the ramp signal RS or control the gain amplifier 13 to decrease the amplification ratio, to adjust these parameters toward the triggerable range.

In addition, as shown in FIG. 7, the ramp signal RS may start to rise at the start time of the half signal cycle, as different from the ramp signal RS shown in FIG. 2 which starts to fall at the second half period of the previous signal cycle. In fact, the time point on which the ramp signal RS starts to rise or fall may be configured arbitrarily, as long as the ramp signal RS may generate a trigger successfully. In addition, the ramp signal RS may return to the original voltage level at any time point after the trigger is completed and before the next signal cycle starts, and its recovery time is not a limitation of the scope of the present invention.

Figure 8:
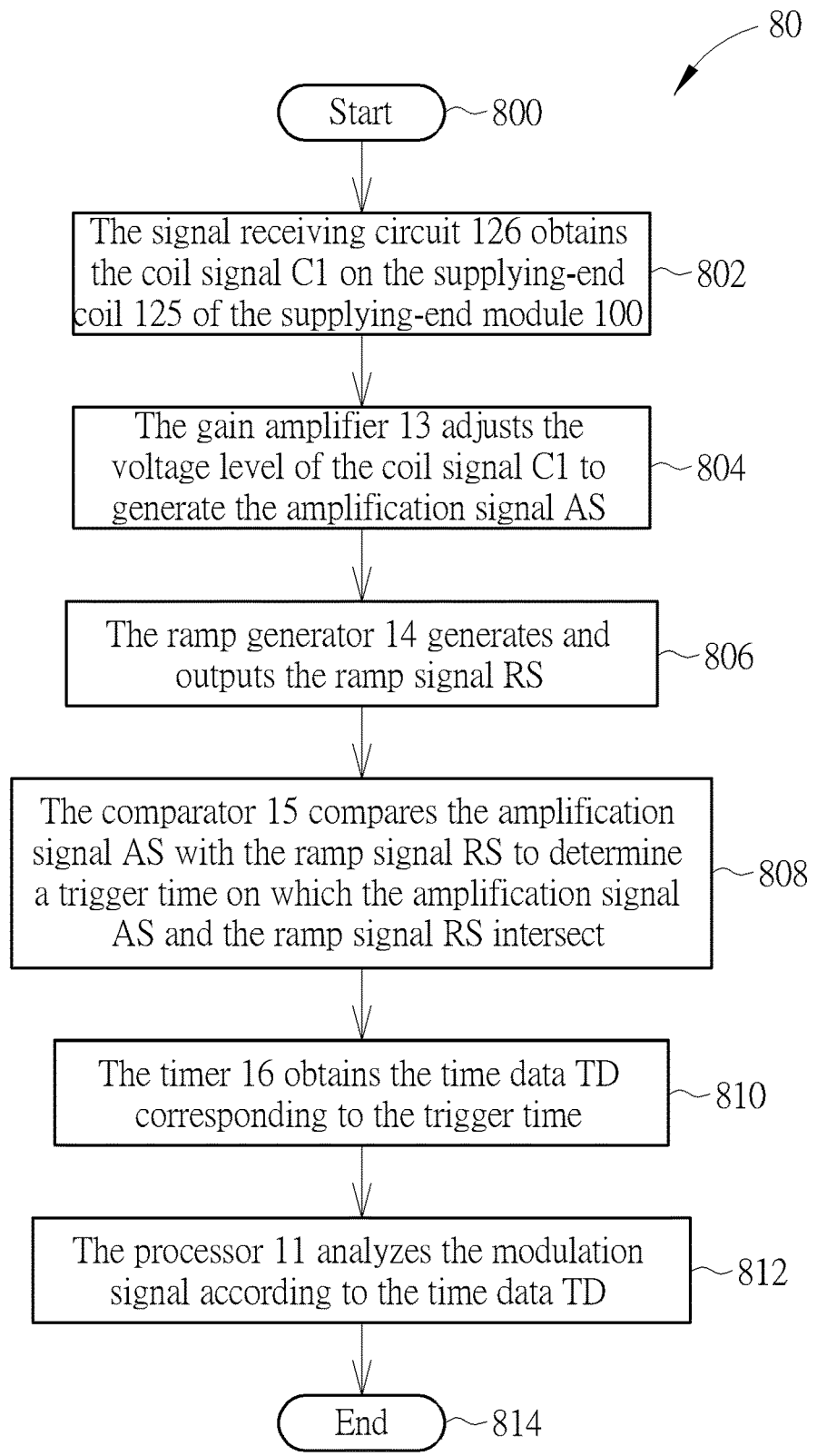
FIG. 8 is a schematic diagram of a signal analysis process according to an embodiment of the present invention.

The abovementioned operations of signal analysis and interpretation of the supplying-end module 100 may be summarized into a signal analysis process 80, as shown in FIG. 8. The signal analysis process 80 includes the following steps:

Step 800: Start.

Step 802: The signal receiving circuit 126 obtains the coil signal C1 on the supplying-end coil 125 of the supplying-end module 100.

Step 804: The gain amplifier 13 adjusts the voltage level of the coil signal C1 to generate the amplification signal AS.

Step 806: The ramp generator 14 generates and outputs the ramp signal RS.

Step 808: The comparator 15 compares the amplification signal AS with the ramp signal RS to determine a trigger time on which the amplification signal AS and the ramp signal RS intersect.

Step 810: The timer 16 obtains the time data TD corresponding to the trigger time.

Step 812: The processor 11 analyzes the modulation signal according to the time data TD.

Step 814: End.

Please note that the order of the above steps is only served to illustrate various operations of the supplying-end module 100 for signal analysis, and is not used to limit the sequence of performing the steps. For example, the ramp signal RS may be generated before or after the amplification signal AS, and both signals may be output at the same time for comparison. In addition, Steps 802 to 810 may be repeated in each signal cycle, allowing the processor 11 to analyze the modulation data according to variations of the values of the time data TD after multiple time data TD are acquired in multiple signal cycles. Other detailed operations and alterations of the signal analysis process 80 are illustrated in the above paragraphs, and will not be narrated herein.

To sum up, the embodiments of the present invention provide a signal analysis method and circuit, which are used for a supplying-end module of an induction type power supply system, for determining whether the supplying-end module receives a modulation signal from the receiving-end terminal. Through the signal analysis method of the present invention, the coil signal in each signal cycle may undergo signal processing and then be converted into time data. After obtaining a time data string generated in multiple consecutive signal cycles, the processor may perform signal interpretation according to the variations of data values. In detail, the coil signal may be amplified by the gain amplifier to generate an amplification signal, which is compared with a ramp signal for triggering, so as to obtain a trigger time on which the two signals intersect. The timer may further obtain time data corresponding to the trigger time, and then output the time data to the processor for analysis. The processor may determine whether the feature of up and down jitter appears on the signal according to relative variations of a series of time data. Through the signal analysis method of the present invention, the corresponding digital value of the time data may be generated as long as the trigger is successful, and real-time signal analysis may be realized. Further, although the voltage of the coil signal will vary with the load or output power, the amplification ratio of the gain amplifier and the slope of the ramp signal may be adjusted correspondingly, in order to generate a trigger. As a result, the signal analysis method of the present invention is applicable to a wide range of coil voltages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal analysis circuit for a supplying-end module of an induction type power supply system, the signal analysis circuit comprising:

a signal receiving circuit, configured to obtain a coil signal on a supplying-end coil of the supplying-end module;

a gain amplifier, coupled to the signal receiving circuit, configured to adjust a voltage level of the coil signal to generate an amplification signal;

a ramp generator, configured to generate and output a ramp signal;

a comparator, coupled to the gain amplifier and the ramp generator, configured to compare the amplification signal with the ramp signal to determine a trigger time on which the amplification signal and the ramp signal intersect;

a timer, coupled to the comparator, configured to convert the trigger time into a time data, wherein the time data comprises a series of digital values each corresponding to a height of the coil signal; and a processor, coupled to the timer, configured to determine whether there is a modulation signal carried on the coil signal according to the time data;

wherein the modulation signal is generated by a receiving-end module and fed back to the supplying-end module to be reflected on an amplitude of the coil signal of the supplying-end coil;

wherein the comparator compares the amplification signal with the ramp signal at the start of a half signal cycle, allowing the processor to determine whether the ramp signal is in a triggerable range; and wherein the processor adjusts at least one of a slope of the ramp signal and an amplification ratio of the gain amplifier when determining that the ramp signal is not in the triggerable range.

2. The signal analysis circuit of claim 1, wherein the timer starts to run at a start time of a signal cycle, and a timer period of the timer is obtained as the trigger time when the amplification signal and the ramp signal intersect.

3. The signal analysis circuit of claim 1, wherein when the amplification signal and the ramp signal do not intersect during the half signal cycle, the processor is further configured to perform at least one of the following steps:
controlling the ramp generator to increase the slope of the ramp signal; and
controlling the gain amplifier to increase or decrease the amplification ratio.

4. The signal analysis circuit of claim 1, wherein the ramp signal is a falling signal, and when the comparator determines that the ramp signal is smaller than the amplification signal at the start of the half signal cycle, the processor determines that the ramp signal is not in the triggerable range and is configured to perform at least one of the following steps:
controlling the ramp generator to decrease the slope of the ramp signal; and
controlling the gain amplifier to decrease the amplification ratio.

5. The signal analysis circuit of claim 1, wherein the ramp signal is a rising signal, and when the comparator determines that the ramp signal is greater than the amplification signal at the start of the half signal cycle, the processor determines that the ramp signal is not in the triggerable range and is configured to perform at least one of the following steps:
controlling the ramp generator to decrease the slope of the ramp signal; and
controlling the gain amplifier to increase the amplification ratio.

6. The signal analysis circuit of claim 1, wherein a signal cycle of the timer obtaining the time data corresponds to a coil driving cycle of a power driver circuit of the induction type power supply system driving the supplying-end coil.

7. The signal analysis circuit of claim 6, wherein the processor is further configured to synchronize a timing operation of the timer with a driving operation of the power driver circuit.

8. A signal analysis method for a supplying-end module of an induction type power supply system, the signal analysis method comprising:
obtaining a coil signal on a supplying-end coil of the supplying-end module;
adjusting a voltage level of the coil signal to generate an amplification signal;
generating and outputting a ramp signal;
comparing the amplification signal with the ramp signal to determine a trigger time on which the amplification signal and the ramp signal intersect;
converting the trigger time into a time data, wherein the time data comprises a series of digital values each corresponding to a height of the coil signal; and
determining whether there is a modulation signal carried on the coil signal according to the time data;
wherein the modulation signal is generated by a receiving-end module and fed back to the supplying-end module to be reflected on an amplitude of the coil signal of the supplying-end coil;
wherein the amplification signal is compared with the ramp signal at the start of a half signal cycle, to determine whether the ramp signal is in a triggerable range; and
wherein at least one of a slope of the ramp signal and an amplification ratio of a gain amplifier is adjusted when the ramp signal is determined to be not in the triggerable range.

9. The signal analysis method of claim 8, wherein the step of determining the trigger time on which the amplification signal and the ramp signal intersect comprises:
starting to run a timer at a start time of a signal cycle, and obtaining a timer period of the timer as the trigger time when the amplification signal and the ramp signal intersect.

10. The signal analysis method of claim 8, wherein when the amplification signal and the ramp signal do not intersect during the half signal cycle, the signal analysis method further comprises at least one of the following steps:
increasing the slope of the ramp signal; and
increasing or decreasing the amplification ratio of the gain amplifier for the coil signal.

11. The signal analysis method of claim 8, wherein the ramp signal is a falling signal, and the signal analysis method further comprises:
when determining that the ramp signal is smaller than the amplification signal at the start of the half signal cycle, determining that the ramp signal is not in the triggerable range and performing at least one of the following steps:
decreasing the slope of the ramp signal; and
decreasing the amplification ratio of the gain amplifier for the coil signal.

12. The signal analysis method of claim 8, wherein the ramp signal is a rising signal, and the signal analysis method further comprises:
when determining that the ramp signal is greater than the amplification signal at the start of the half signal cycle, determining that the ramp signal is not in the triggerable range and performing at least one of the following steps:
decreasing the slope of the ramp signal; and
increasing the amplification ratio of the gain amplifier for the coil signal.

13. The signal analysis method of claim 8, wherein a signal cycle of obtaining the time data corresponds to a coil driving cycle of driving the supplying-end coil.

14. The signal analysis method of claim 13, further comprising:
synchronizing a timing operation of obtaining the time data with a driving operation of driving the supplying-end coil.

15. A supplying-end module of an induction type power supply system, comprising:
a supplying-end coil; and a signal analysis circuit, comprising:
- a signal receiving circuit, configured to obtain a coil signal on the supplying-end coil;
- a gain amplifier, coupled to the signal receiving circuit, configured to adjust a voltage level of the coil signal to generate an amplification signal;
- a ramp generator, configured to generate and output a ramp signal;
- a comparator, coupled to the gain amplifier and the ramp generator, configured to compare the amplification signal with the ramp signal to determine a trigger time on which the amplification signal and the ramp signal intersect;
- a timer, coupled to the comparator, configured to convert the trigger time into a time data, wherein the time data comprises a series of digital values each corresponding to a height of the coil signal; and
- a processor, coupled to the timer, configured to determine whether there is a modulation signal carried on the coil signal according to the time data;

wherein the modulation signal is generated by a receiving-end module and fed back to the supplying-end module to be reflected on an amplitude of the coil signal of the supplying-end coil;

wherein the comparator compares the amplification signal with the ramp signal at the start of a half signal cycle, allowing the processor to determine whether the ramp signal is in a triggerable range; and wherein the processor adjusts at least one of a slope of the ramp signal and an amplification ratio of the gain amplifier when determining that the ramp signal is not in the triggerable range.

\* \* \* \* \*